(12) United States Patent
Lee et al.

(10) Patent No.: US 11,740,395 B2
(45) Date of Patent: *Aug. 29, 2023

(54) DISPLAY DEVICES INCLUDING MIRROR SUBSTRATES AND METHODS OF MANUFACTURING MIRROR SUBSTRATES

(71) Applicant: Samsung Display Co., Ltd., Yongin-Si (KR)

(72) Inventors: Dae-Woo Lee, Hwaseong-si (KR); Byoung-Ki Kim, Seoul (KR); Ho-Jin Yoon, Hwaseong-si (KR); Yun-Mo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/648,770

(22) Filed: Jan. 24, 2022

(65) Prior Publication Data

US 2022/0146720 A1    May 12, 2022

Related U.S. Application Data

(60) Continuation of application No. 16/453,970, filed on Jun. 26, 2019, now Pat. No. 11,249,229, which is a (Continued)

(30) Foreign Application Priority Data

Aug. 17, 2015  (KR) .................. 10-2015-0115624

(51) Int. Cl.
*G02B 5/08* (2006.01)
*H10K 50/856* (2023.01)

(52) U.S. Cl.
CPC ......... *G02B 5/0875* (2013.01); *H10K 50/856* (2023.02)

(58) Field of Classification Search
None
See application file for complete search history.

(56) References Cited

U.S. PATENT DOCUMENTS 8,597,740 B2    12/2013  Matsuo
8,933,625 B2 *   1/2015  Chung ................ H01L 51/5271
                                                        313/506

(Continued)

FOREIGN PATENT DOCUMENTS

KR    10-2008-0110750 A    12/2008
KR    10-2009-0094692 A    9/2009

(Continued)

*Primary Examiner* — Ryan Crockett
(74) *Attorney, Agent, or Firm* — Innovation Counsel LLP

(57) ABSTRACT

A display device may include a display unit disposed on a substrate and a mirror substrate facing the substrate with respect to the display unit. The mirror substrate may include a first mirror layer extending continuously on a surface of a transparent substrate and a plurality of mirror patterns on the first mirror layer. The first mirror layer is formed on both a region in which the plurality of mirror patterns are formed and a region in which the plurality of mirror patterns are not formed. External light is incident to and reflected by the first mirror layer, thus reducing an image haze and enhancing a display quality of the display device. In addition, the first mirror layer and the plurality of mirror patterns may be formed by using a single halftone mask to simplify the manufacturing process and increase a productivity of the mirror substrate.

16 Claims, 10 Drawing Sheets

Related U.S. Application Data division of application No. 15/080,455, filed on Mar. 24, 2016, now Pat. No. 10,371,986.

(56) References Cited

U.S. PATENT DOCUMENTS

| | | | | |
|---|---|---|---|---|
| 2009/0027773 | A1* | 1/2009 | Kawakami | G02B 5/3058 359/485.05 |
| 2012/0050299 | A1* | 3/2012 | Mignard | G02B 26/001 359/290 |
| 2012/0236385 | A1* | 9/2012 | Yun | G02B 5/003 359/885 |
| 2013/0146902 | A1* | 6/2013 | Ryu | G02F 1/133528 257/E33.012 |
| 2014/0160411 | A1* | 6/2014 | Yim | H01L 51/5237 313/504 |
| 2015/0002953 | A1* | 1/2015 | Yoon | B60R 1/12 445/24 |
| 2015/0034918 | A1* | 2/2015 | Yim | H01L 51/56 257/40 |
| 2016/0260931 | A1* | 9/2016 | Kim | H01L 51/5246 |
| 2016/0291219 | A1* | 10/2016 | Lee | G02B 5/0858 |
| 2017/0045651 | A1* | 2/2017 | Bae | B82Y 30/00 |
| 2017/0052409 | A1* | 2/2017 | Lee | G02F 1/133553 |
| 2017/0054111 | A1* | 2/2017 | Kim | H01L 51/56 |
| 2017/0070679 | A1* | 3/2017 | Chung | H04N 5/2257 |
| 2017/0077457 | A1* | 3/2017 | Lee | H01L 51/5271 |
| 2017/0097545 | A1 | 4/2017 | Yim et al. | |
| 2017/0192300 | A1* | 7/2017 | Chung | H01L 51/5271 |
| 2017/0205543 | A1* | 7/2017 | Yim | H01L 33/60 |
| 2017/0256747 | A1* | 9/2017 | Lee | H01L 27/3218 |

FOREIGN PATENT DOCUMENTS

| | | |
|---|---|---|
| KR | 10-2010-0051485 A | 5/2010 |
| KR | 10-2014-0073216 A | 6/2014 |
| KR | 10-2015-0003466 A | 1/2015 |
| KR | 10-2015-0016031 A | 2/2015 |

* cited by examiner

DISPLAY DEVICES INCLUDING MIRROR SUBSTRATES AND METHODS OF MANUFACTURING MIRROR SUBSTRATES

CROSS-REFERENCE TO RELATED APPLICATION

This application is a continuation application of U.S. patent application Ser. No. 16/453,970 filed Jun. 26, 2019, which is a divisional application of U.S. patent application Ser. No. 15/080,455 filed Mar. 24, 2016 (now U.S. Pat. No. 10,371,986), which claims priority to and the benefit of Korean Patent Application No. 10-2015-0115624 filed on Aug. 17, 2015, in the Korean Intellectual Property Office, the disclosures of which are incorporated herein in their entirety by reference.

BACKGROUND

1. Field

The present disclosure relates to display devices, more particularly, display devices including a mirror substrate having a plurality of mirror patterns and methods of manufacturing the mirror substrate.

2. Description of the Related Art

Recently, display devices such as an organic light emitting display (OLED) device and a liquid crystal display (LCD) device having a mirror property together with an image display property have been widely developed and used for various applications. Layered structures or patterns having a reflective index may be inserted to a display device to provide a mirror property. However, a manufacturing process or a display quality may be adversely affected due to the provision of the mirror property. Further, due to the structural differences between a region in which the mirror patterns are formed and a neighboring region in which the mirror patterns are not formed, a display quality may be compromised and an image haze may occur.

SUMMARY

Example embodiments provide a display device including a mirror substrate having an improved display quality and a method of manufacturing the mirror substrate.

According to example embodiments, the display device may include a display unit disposed on a substrate and a mirror substrate facing the substrate with respect to the display unit. The mirror substrate may include a first mirror layer extending continuously on a surface of a transparent substrate and a plurality of mirror patterns on the first mirror layer.

In example embodiments, the first mirror layer may include a plurality of first metal layers sequentially stacked on one another. The plurality of mirror patterns include a plurality of second metal layers sequentially stacked on one another.

In example embodiments, a material of one of the first metal layers of the first mirror layer may be substantially the same as a material of a respective one of the second metal layers of the plurality of mirror patterns.

In example embodiments, the display device may further include a second mirror layer extending continuously along the first mirror layer and the plurality of mirror patterns. The second mirror layer may be stacked on the first mirror layer and the plurality of mirror patterns.

In example embodiments, the second mirror layer may include a plurality of third metal layers sequentially stacked on one another.

In example embodiments, a material of the second mirror layer may be substantially the same as a material of the first mirror layer.

In example embodiments, the display device may further include a sealing member encapsulating the display unit between the substrate and the mirror substrate. The sealing member may be in contact with the first mirror layer.

In example embodiments, the transparent substrate may be divided into a first region and a second region by the sealing member. The first region may overlap the display unit. The plurality of mirror patterns and the first mirror layer may be arranged throughout the first region and the second region.

In example embodiments, the display unit may include an emitting region and a non-emitting region. The emitting region may overlap a portion of the first mirror layer between neighboring ones of the plurality of mirror patterns. The non-emitting region may overlap a stacked structure including the first mirror layer and each of the plurality of mirror patterns.

In example embodiments, the emitting region may include an organic emitting layer or a liquid crystal layer.

According to example embodiments, there is provided a method of manufacturing a mirror substrate. In the method, a transparent substrate including a first region and a second region may be provided. A first mirror layer and a plurality of mirror patterns may be formed to be distributed throughout the first region and the second region of the transparent substrate. A sealing member may be formed between the first region and the second region such that the sealing member is in contact with the first mirror layer.

In example embodiments, forming the first mirror layer and the plurality of mirror patterns may include sequentially forming first and second metal layers on the transparent substrate. The first and second metal layers may be patterned by using a halftone mask.

In example embodiments, forming the first mirror layer may include forming a plurality of third metal layers. Forming the second mirror layer may include forming a plurality of fourth metal layers.

In example embodiments, a material of one of the third metal layers of the first mirror layer may be substantially the same as a material of a respective one of the fourth layers of the plurality of mirror patterns.

In example embodiments, forming the first mirror layer and the plurality of mirror patterns may further include forming a second mirror layer extending continuously along the first mirror layer and the plurality of mirror patterns.

In example embodiments, a thickness of one of the first and second mirror layers may be less than a thickness of a respective one of the plurality of mirror patterns.

In example embodiments, the second mirror layer may be formed to be distributed throughout the first region and the second region of the transparent substrate.

In example embodiments, forming the second mirror layer may include sequentially forming a plurality of fifth metal layers.

In example embodiments, the second mirror layer may include a material that is substantially the same as that of the first mirror layer.

In example embodiments, the second mirror layer may include a material that is substantially the same as that of a respective one of the mirror patterns.

According to a mirror substrate in accordance with example embodiments, the first mirror layer may be formed on the entire surface of the transparent substrate, and the plurality of mirror patterns may be formed on the first mirror layer.

Accordingly, the first mirror layer is formed on both a region in which the plurality of mirror patterns are formed and a region in which the mirror patterns are not formed. External light that is incident on both the region in which the mirror patterns are formed and the region in which the mirror patterns are not formed is incident to and reflected by the first mirror layer, thus reducing an image haze and enhancing a display quality of the display device.

In addition, the first mirror layer and the mirror patterns may be formed by using a single halftone mask, the manufacturing process may be simplified and a productivity may be increased.

BRIEF DESCRIPTION OF THE DRAWINGS

Example embodiments will be more clearly understood from the following detailed description taken in conjunction with the accompanying drawings.

FIG. 1 is a cross-sectional view illustrating a mirror substrate in accordance with example embodiments.

FIGS. 2, 3, 4, 5, 6, 7, 8, and 9 are cross-sectional views illustrating a method of manufacturing a mirror substrate in accordance with example embodiments.

FIG. 10 is a cross-sectional view illustrating a mirror substrate in accordance with example embodiments.

FIGS. 11, 12, and 13 are cross-sectional views illustrating a method of manufacturing a mirror substrate in accordance with example embodiments.

FIG. 14 is a schematic cross-sectional view illustrating a display device in accordance with example embodiments.

FIG. 15 is a partial enlarged view of a portion indicated as "A" in FIG. 14.

FIG. 16 is a schematic cross-sectional view illustrating a display device in accordance with some example embodiments.

FIG. 17 is a partial enlarged view of a portion indicated as "B" in FIG. 16.

DETAILED DESCRIPTION OF THE EMBODIMENTS

Figure 1:
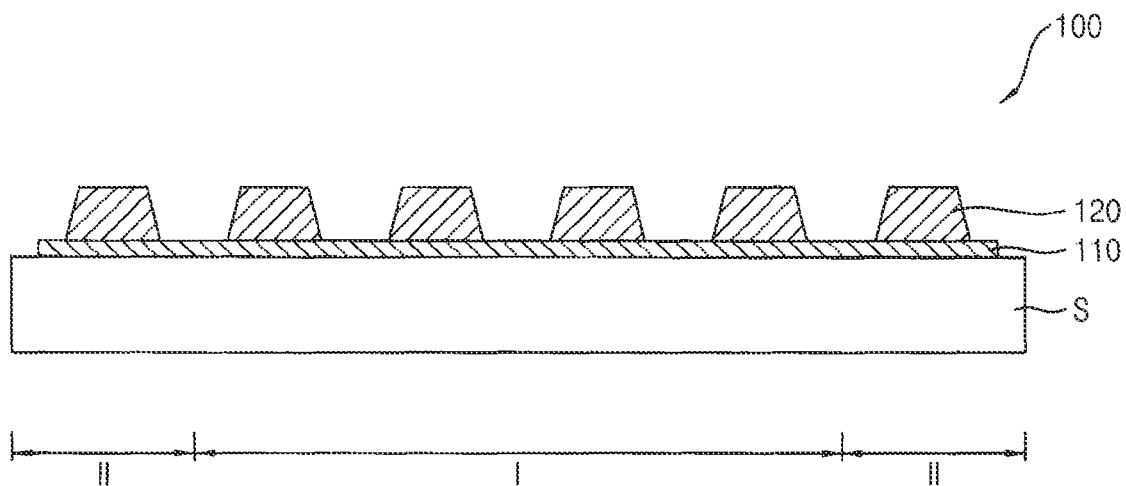
FIGS. 1 to 17 illustrate non-limiting, example embodiments as described herein.

The present disclosure describes various example embodiments with reference to the accompanying drawings, in which some example embodiments are shown. The present disclosure may, however, be embodied in many different forms and should not be construed as being limited to the example embodiments set forth herein. Rather, these example embodiments are provided so that the present disclosure will be thorough and complete, and will fully convey the scope of the present inventive concept to those skilled in the art. In the drawings, the sizes and relative sizes of layers and regions may be exaggerated for clarity. Like numerals refer to like elements throughout.

FIG. 1 is a cross-sectional view illustrating a mirror substrate in accordance with example embodiments. A mirror substrate 100 may include a first mirror layer 110 extending continuously on a surface of a transparent substrate S and a plurality of mirror patterns 120 arranged on the first mirror layer 120. The transparent substrate S may be divided into a first region I and a second region II. The first region I may overlap pixel regions of a display device. The mirror substrate 100 may be provided as an encapsulation substrate of the display device. The second region II may overlap a peripheral region in which a pad connected to a driving circuit of the display device and/or a flexible printed circuit (FPC) may be placed. The transparent substrate S may be a glass substrate or a transparent plastic substrate.

The first mirror layer 110 may extend continuously throughout the first region I and the second region II of the transparent substrate S. In some embodiments, the first mirror layer 110 may include a plurality of metal layers sequentially stacked on top of one another. In other embodiments, the first mirror layer 110 may have a single metal-layered structure. The first mirror layer 110 may include a metal such as aluminum (Al), chromium (Cr), copper (Cu), silver (Ag), titanium (Ti), tantalum (Ta), molybdenum (Mo), tungsten (W), etc. In some embodiments, the first mirror layer 110 may have a double-layered structure or a triple-layered structure that includes a plurality of different metal layers. For example, the first mirror layer 110 may include first and second metal layers sequentially stacked on the transparent substrate S. The first metal layer may include silver (Ag) and the second metal layer may include Indium Tin Oxide (ITO). In some embodiments, the first mirror layer 110 may include third to fifth metal layers. The third metal layers may include ITO, the fourth metal layer may include silver, and the fifth metal layer may include ITO.

The first mirror layer 110 may cover the surface of the transparent substrate S. In example embodiments, the first mirror layer 110 may extend commonly and continuously on both the first and second regions I and II of the transparent substrate S.

The first mirror layer 110 may have a predetermined reflectivity due to a change of a refractive index therein. In some embodiments, the reflectivity of the first mirror layer 110 may be less than the reflectivity of the mirror patterns 120.

The mirror patterns 120 may be arranged throughout the first and second regions I and II of the transparent substrate S. For example, the mirror patterns 120 may be arranged in a grid shape, a line shape, a mesh shape, or a plurality of islands shape.

The mirror patterns 120 may include a material having a high reflectivity. In example embodiments, the mirror pattern 110 may include a metal such as aluminum (Al), chromium (Cr), copper (Cu), silver (Ag), titanium (Ti), tantalum (Ta), molybdenum (Mo), and tungsten (W).

As described above, when the mirror substrate 100 serves as an encapsulation substrate of the display device, the mirror patterns 120 may overlap a region except for an emitting region among the pixel region, herein referred to as a non-emitting region. In this case, an area between the neighboring mirror patterns 120 of the mirror substrate 100 may overlap the emitting region of the pixel region in the display device.

In some embodiments, the mirror patterns 120 may include sixth and seventh metal layers sequentially stacked on the first mirror layer 110. The sixth metal layer may include silver (Ag), and the seventh metal layer may include ITO.

In other embodiments, the mirror patterns 120 may include eighth to tenth metal layers sequentially stacked on the first mirror layer 110. The eighth metal layer may include ITO or aluminum (Al), the ninth metal layer may include silver, and the tenth metal layer may include ITO.

In example embodiments, the first mirror layer 110 may include a material that is substantially the same as a material of the mirror patterns 120. The first mirror layer 110 may be thinner than the mirror patterns 120.

According to the mirror substrate 100 in accordance with example embodiments, the first mirror layer 110 may be formed on the surface of the transparent substrate S, and the mirror patterns 120 may be formed on the first mirror layer 110. The first mirror layer 110 may be formed on both a region in which the mirror patterns 120 are formed and a region in which the mirror patterns 120 are not formed. External light that is incident on both the region in which the mirror patterns 120 are formed and the region in which the mirror patterns 120 are not formed is incident to and reflected by the first mirror layer 110, thus reducing an image haze and enhancing a display quality of the display device.

FIGS. 2 to 9 are cross-sectional views illustrating a method of manufacturing a mirror substrate in accordance with example embodiments. For example, FIGS. 2 to 9 illustrate a method of manufacturing the mirror substrate 100 shown in FIG. 1.

Figure 2:
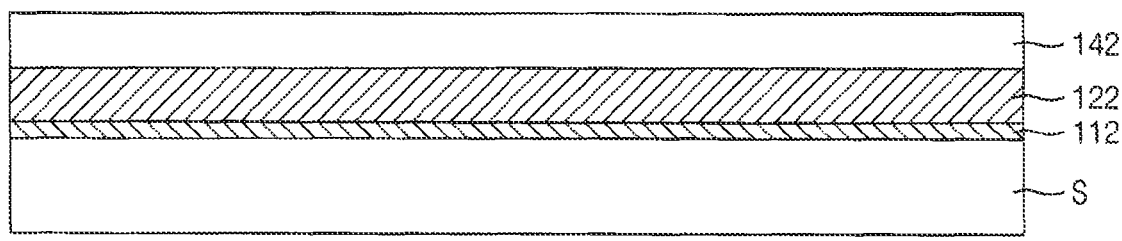

Referring to FIG. 2, a first metal layer 112, a second metal layer 122, and photoresist layer 142 may be sequentially formed on a transparent substrate S. For example, the first and second metal layers 112 and 122 may be formed of various materials including, but not limited to, Al, Cr, Cu, Ag, Ti, Ta, Mo, and W. These materials may be used alone or in a combination to form the first and second metal layers 112 and 122. The first and second metal layers 112 and 122 may be formed by various processes including, but not limited to, a sputtering process, a physical vapor deposition (PVD) process, an atomic layer deposition (ALD) process, and a chemical vapor deposition (CVD) process. The photoresist layer 142 may be formed on the second metal layer 122 by a spin coating process.

Figure 3:
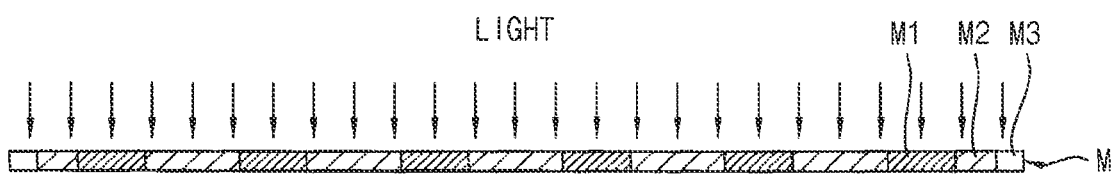
Figure 3:
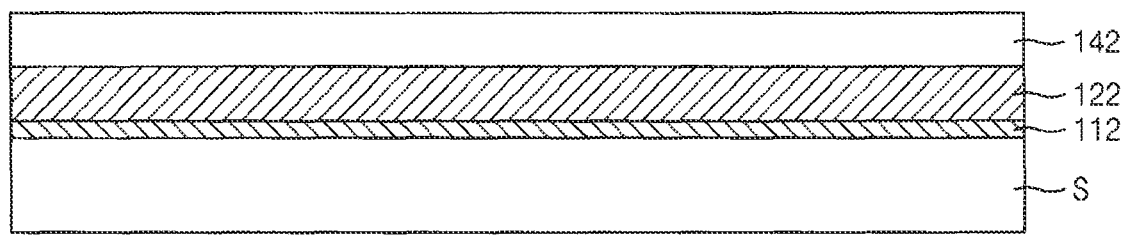
Figure 4:
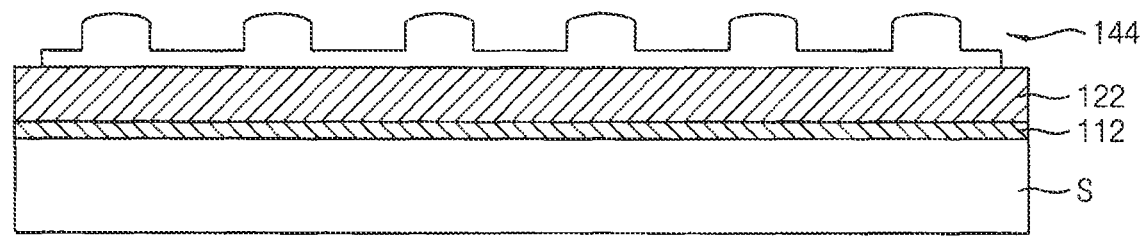

Referring to FIGS. 3 and 4, a halftone mask M may be arranged over the transparent substrate S, and a beam of light that is incident to the photoresist layer 142 may pass through the halftone mask M to form a first photoresist pattern 144. The halftone mask M may include a non-transmitting region M1, a half-transmitting region M2, and a transmitting region M3. For example, the non-transmitting region M1 may overlap a non-emitting region of a display unit of a display device, and the half-transmitting region M2 may overlap an emitting region of the display unit of the display device. The halftone mask M may include a polarizing region. The first photoresist pattern 144 may have a smaller thickness at a portion that overlaps the non-emitting region than a thickness of another portion that overlaps the emitting region.

Figure 5:
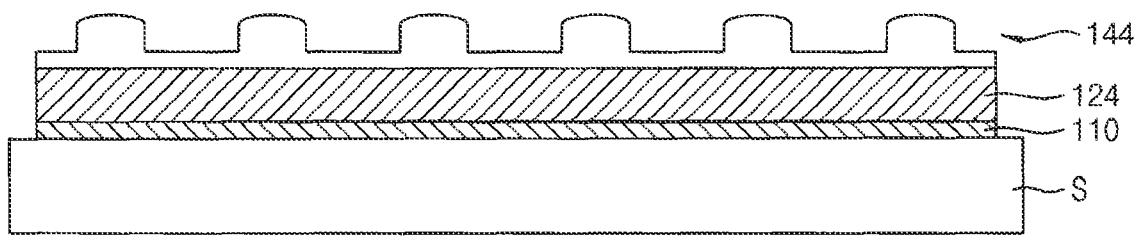

Referring to FIG. 5, the first and second metal layers 112 and 122 may be etched using the first photoresist pattern 144 as an etch stop layer. A first mirror layer 110 and a preliminary mirror pattern 124 may be formed on the transparent substrate S by etching the first and second metal layers 112 and 122. For example, the first and second metal layers 112 and 122 may be wet-etched or dry-etched using the first photoresist pattern 144 as an etch stop layer.

Figure 6:
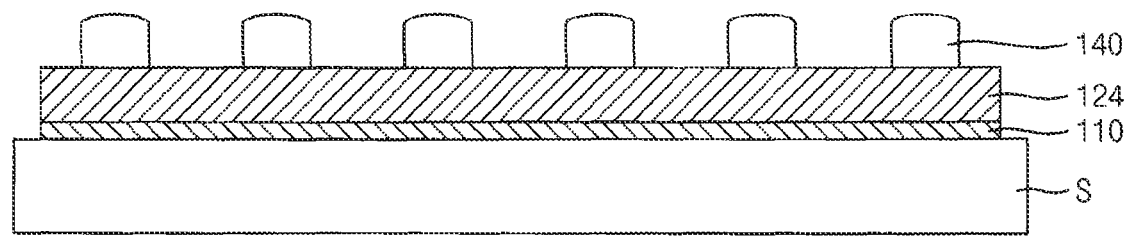

Referring to FIG. 6, a second photoresist pattern 140 may be formed by partially removing the first photoresist pattern 144. In one embodiment, the second photoresist pattern 140 may be formed by partially removing a portion of the first photoresist pattern 144 that is formed by the half-transmitting region M2 of the halftone mask M as illustrated in FIG. 3 in a thickness direction. An upper surface of the preliminary mirror pattern 124 may be partially exposed by the second photoresist pattern 140. For example, the upper surface of the preliminary mirror pattern 124 that may overlap the emitting region of the display unit of the display device may be exposed by the second photoresist pattern 140. For example, by an ashing process, the first photoresist pattern 144 may be partially removed to form the second photoresist pattern 140.

Figure 7:
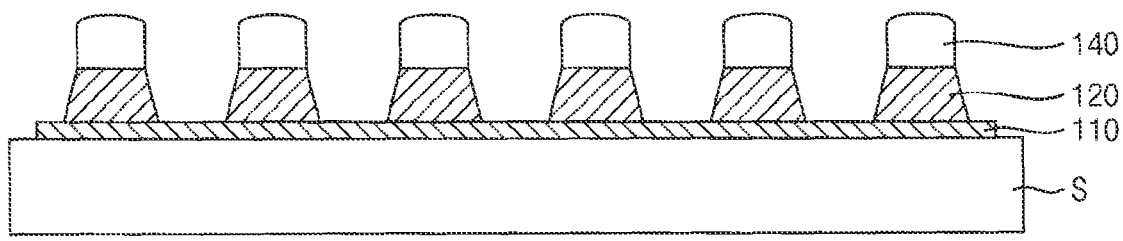

Referring to FIG. 7, the preliminary mirror pattern 124 may be etched using the second photoresist pattern 140 as an etch stop layer. By etching an exposed portion of the preliminary mirror pattern 124 that overlaps the emitting region of the display unit of the display device, a plurality of mirror patterns 120 may be formed on the first mirror layer 110. For example, the mirror patterns 120 may be formed in a grid arrangement, a mesh arrangement, or an arrangement including a plurality of islands in the first and second regions I and II of the transparent substrate S.

Figure 8:
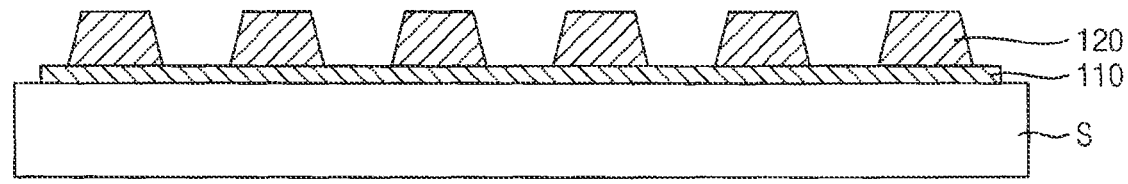
Figure 8:
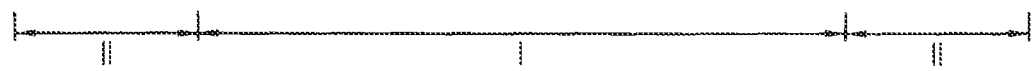
Figure 9:
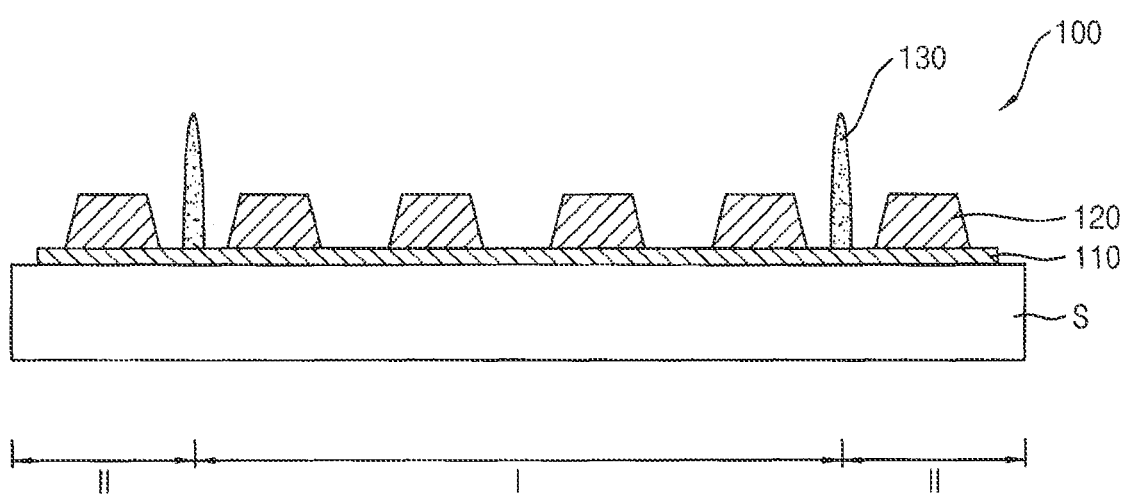

Referring to FIGS. 8 and 9, the second photoresist pattern 140 may be removed by an ashing process, and a sealing member 130 may be formed at a boundary between the first region I and the second region II to manufacture a mirror substrate 100. For example, the sealing member 130 may be formed using an adhesive resin material such as an epoxy resin and a silicone resin by a printing process or a coating process. In example embodiments, the sealing member 130 may be formed directly on a surface of the first mirror layer 110.

According to a method of manufacturing the mirror substrate 100 in accordance with example embodiments, the first mirror layer 110 may be formed on the surface of the transparent substrate S, and the mirror patterns 120 may be formed on the first mirror layer 110. The first mirror layer 110 may be formed on both a region in which the mirror patterns 120 are formed and a region in which the mirror patterns 120 are not formed. External light that is incident on both the region in which the mirror patterns 120 are formed and the region in which the mirror patterns 120 are not formed is incident to and reflected by the first mirror layer 110, thus reducing an image haze and enhancing a display quality of the display device. In particular, the first mirror layer 110 and the mirror patterns 120 may be formed using a single halftone mask M to simplify the manufacturing process and increase a productivity of the mirror substrate 100.

Figure 10:
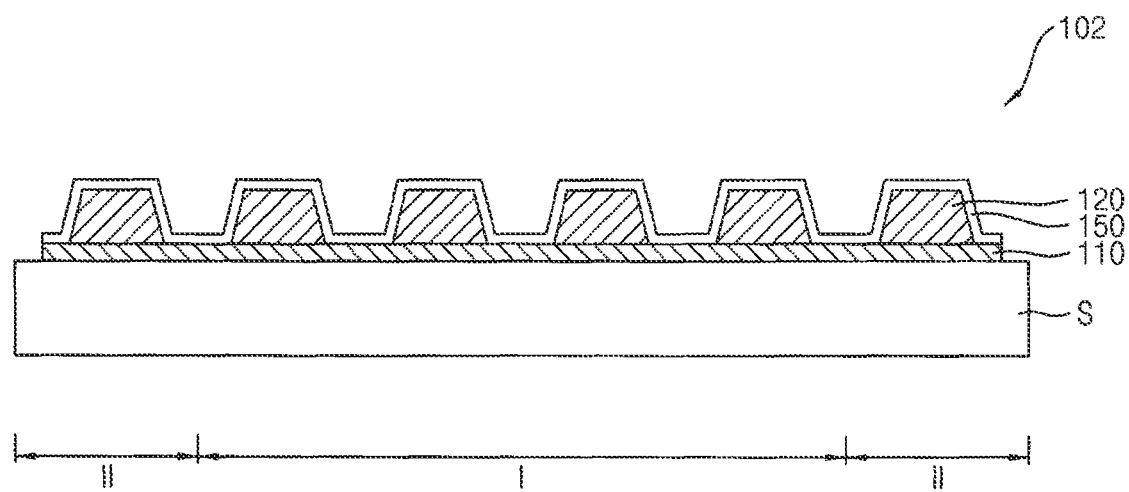

FIG. 10 is a cross-sectional view illustrating a mirror substrate in accordance with example embodiments. A mirror substrate 102 may have structures and/or constructions substantially the same as or similar to those of the mirror substrate 100 illustrated in FIG. 1 except for a second mirror layer. Thus, detailed descriptions on repeated elements and/or structures may be omitted herein. The mirror substrate 102 may include a first mirror layer 110 that extends continuously on a surface of the transparent substrate S, a plurality of mirror patterns 120 that are arranged on the first mirror layer 110, and a second mirror layer 150 that extends along surfaces of the first mirror patterns 120 and an upper surface of the first mirror layer 110 between neighboring mirror patterns 120.

The transparent substrate S may be divided into a first region I and a second region II.

The first region I may overlap pixel regions of a display device when the mirror substrate 100 is provided as an encapsulation substrate of the display device. The second region II may overlap a peripheral region in which a pad connected to a driving circuit of the display device and/or a flexible printed circuit (FPC) may be placed. The transparent substrate S may include a glass substrate or a transparent plastic substrate.

The first mirror layer 110 may extend continuously throughout the first region I and the second region II of the transparent substrate S. In addition, the first mirror layer 110 may include a plurality of metal layers sequentially stacked on top of one another. Alternatively, the first mirror layer 110 may have a single metal-layered structure.

The first mirror layer 110 may cover the surface of the transparent substrate S. In example embodiments, the first mirror layer 110 may extend commonly and continuously both on the first and second regions I and II of the transparent substrate S.

The mirror patterns 120 may be arranged throughout the first and second regions I and II of the transparent substrate S. For example, the mirror patterns 120 may be arranged in a grid shape, a line shape, a mesh shape, or a plurality of islands shape. The mirror patterns 120 may include a material having a high reflectivity. In example embodiments, the mirror pattern 110 may include a metal such as aluminum (Al), chromium (Cr), copper (Cu), silver (Ag), titanium (Ti), tantalum (Ta), molybdenum (Mo), tungsten (W), etc.

The second mirror layer 150 may continuously extend on the first and second regions I and II of the transparent substrate S along the upper surface of the first mirror layer 110 between the neighboring mirror patterns 120 and the surfaces of the mirror patterns 120. The second mirror layer 150 may have a single metal-layered structure. In some embodiments, the second mirror layer 150 may have a double-layered structure or a triple-layered structure that includes a plurality of different metal layers. For example, the second mirror layer 150 may include a metal such as aluminum (Al), chromium (Cr), copper (Cu), silver (Ag), titanium (Ti), tantalum (Ta), molybdenum (Mo), and tungsten (W).

In some embodiments, the second mirror layer 150 may include eleventh and twelfth metal layers sequentially stacked on each other. The eleventh metal layer may include silver (Ag), and the twelfth metal layer may include ITO (Indium Tin Oxide).

In other embodiments, the second mirror layer 150 may include thirteenth to fifteenth metal layers sequentially stacked on one another. The thirteenth metal layer may include ITO or aluminum (Al), the fourteenth metal layer may include silver, and the fifteenth metal layer may include ITO.

In example embodiments, the second mirror layer 150 may include a material that is substantially the same as materials of the first mirror layer 110 and the mirror patterns 120. The second mirror layer 150 may be thinner than the mirror patterns 120.

According to the mirror substrate 100 in accordance with example embodiments, the first mirror layer 110 may be formed on the surface of the transparent substrate S, and the mirror patterns 120 may be formed on the first mirror layer 110. The first mirror layer 110 may be formed on a region in which the mirror patterns 120 are formed and a region in which the mirror patterns 120 are not formed. External light that is incident on both the region in which the mirror patterns 120 are formed and the region in which the mirror patterns 120 are not formed is incident to and reflected by the first mirror layer 110, thus reducing an image haze and enhancing a display quality of the display device. In particular, the second mirror layer 150 may be used to adjust a reflectivity of the display device, thus enhancing a display quality of the display device.

Figure 11:
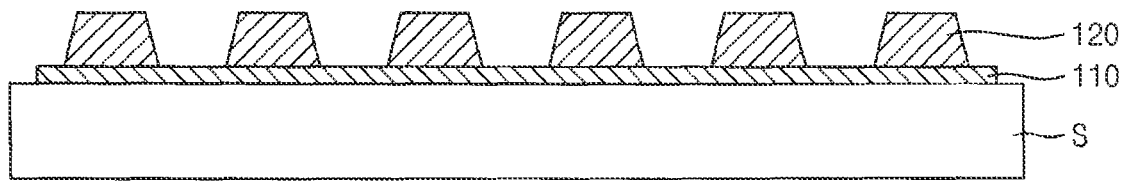
Figure 12:
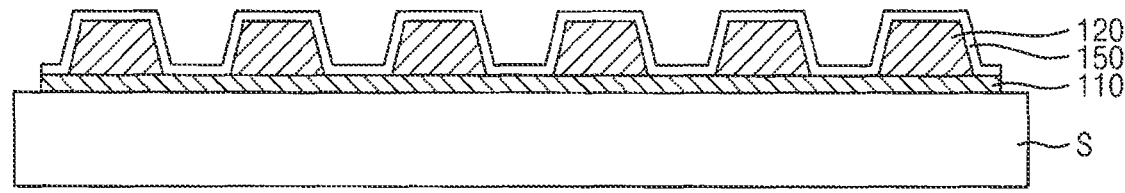
Figure 13:
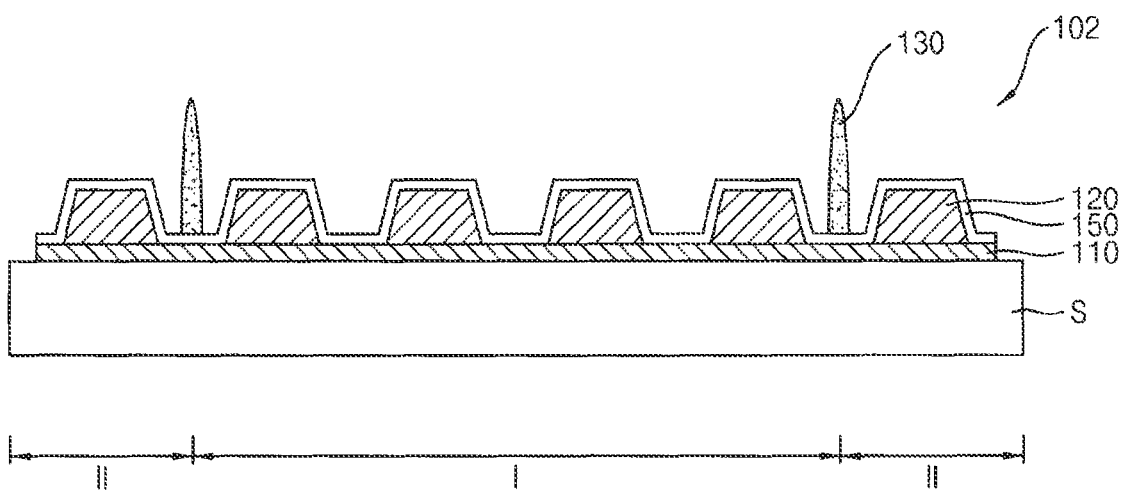

FIGS. 11 to 13 are cross-sectional views illustrating a method of manufacturing a mirror substrate in accordance with example embodiments. For example, FIGS. 11 to 13 illustrate a method of manufacturing the mirror substrate 102 of FIG. 10. Detailed descriptions on processes and materials substantially the same as or similar to those illustrated with reference to FIGS. 2 to 9 may be omitted herein.

Referring to FIG. 11, by processes substantially the same as or similar to those illustrated with reference to FIGS. 2 to 8, a first mirror layer 110 and a plurality of mirror patterns 120 may be formed on a transparent substrate S.

Referring to FIG. 12, a second mirror layer 150 may be formed on portions of the mirror patterns 120 and the first mirror layer 110. For example, a preliminary metal layer (not shown) may be formed on surfaces of the mirror patterns 120 and portions of the first mirror layer 110 that are not covered by the mirror patterns 120. The second mirror layer 150 may be formed by patterning the preliminary metal layer. The preliminary metal layer may be formed by various processes including, but not limited to, a CVD process, a PECVD process, an ALD process, a thermal evaporation process, and a vacuum deposition process.

Referring to FIG. 13, a sealing member 130 may be formed at a boundary between the first region I and the second region II of the mirror substrate 102. The sealing member 130 may be formed directly on a surface of the second mirror layer 150.

According to a method of manufacturing the mirror substrate 102 in accordance with example embodiments, the first mirror layer 110 may be formed on the surface of the transparent substrate S, and the mirror patterns 120 may be formed on the first mirror layer 110. In some embodiments, the first mirror layer 110 may be formed on both a region in which the mirror patterns 120 are formed and a region in which the mirror patterns 120 are not formed. External light that is incident on both the region in which the mirror patterns 120 are formed and the region in which the mirror patterns 120 are not formed is incident to and reflected by the first mirror layer 110, thus reducing an image haze and enhancing a display quality of the display device. In particular, the first mirror layer 110 and the mirror patterns 120 may be formed by using a single halftone mask M to simplify the manufacturing process and increase a productivity of the mirror substrate 102.

Figure 14:
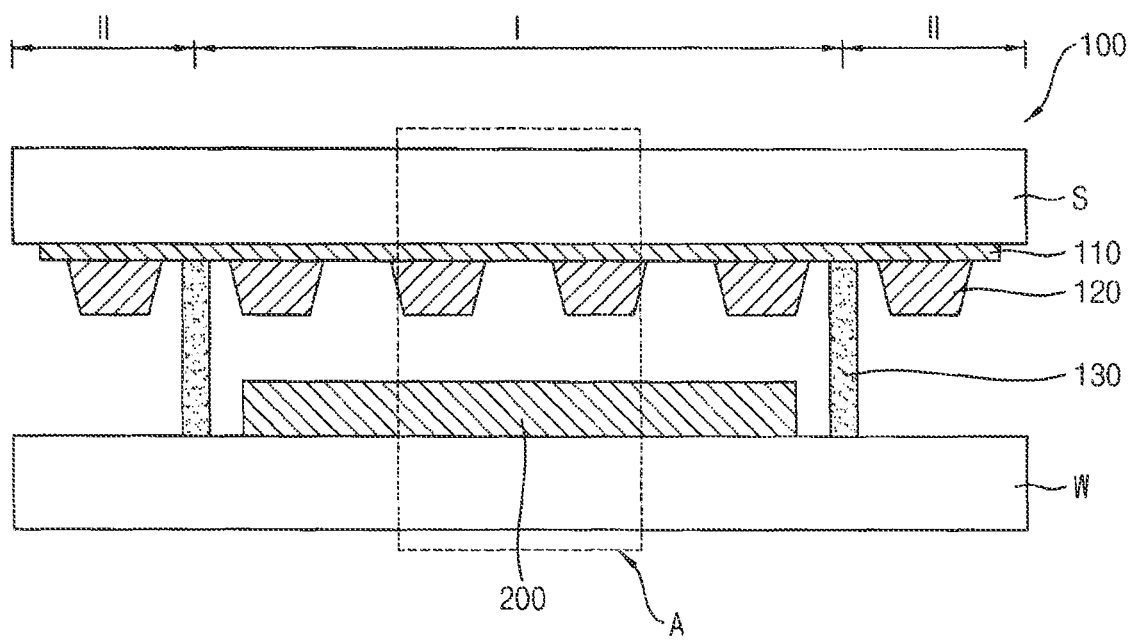
Figure 15:
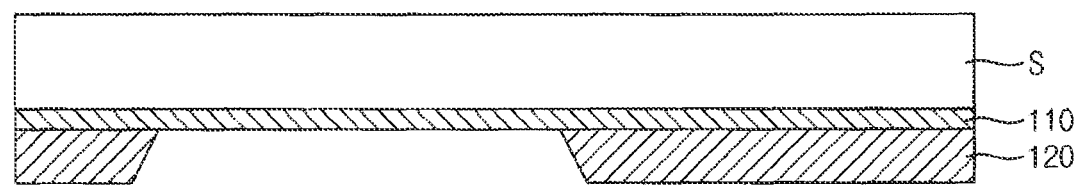
Figure 15:
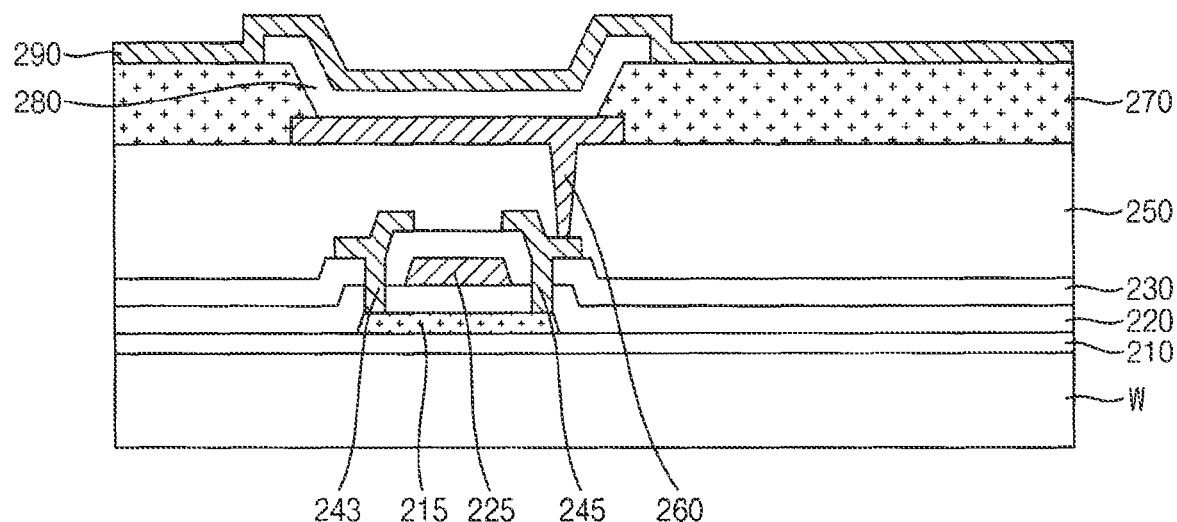

FIG. 14 is a schematic cross-sectional view illustrating a display device in accordance with example embodiments. FIG. 15 is a partial enlarged view of a portion indicated as "A" in FIG. 14. Referring to FIGS. 14 and 15, the display device may include a display unit 200 disposed on a substrate W, and a mirror substrate 100 facing the substrate W with respect to the display unit 200.

In example embodiments, the mirror substrate 100 may have structures and/or constructions substantially the same as or similar to those example embodiments illustrated with reference to FIG. 1. As described above, the mirror substrate 100 may be divided into a first region I and a second region II, and may include a first mirror layer 110 and a plurality of mirror patterns 120 on an opposing surface of a transparent substrate S relative to the substrate W. The first mirror layer 110 may be formed conformally throughout the first and second regions I and II of the transparent substrate S.

A sealing member 130 may be interposed between the transparent substrate S and the substrate W to encapsulate the display unit 200. In this case, the mirror substrate 100 may substantially serve as an encapsulation substrate. The sealing member 130 may be in contact with the first mirror layer 110 of the mirror substrate 100 between the first region I and the second region II to protect the display unit 200. The display unit 200 may overlap the first region I of the mirror substrate 100, and a peripheral circuit such as a driving circuit or a FPC connecting pad may be disposed on a portion of the substrate W overlapping the second region II.

The display unit 200 may include a switching device on the substrate W, and a display structure electrically connected to the switching device. The switching device may include a thin film transistor (TFT) including an active pattern 215, a gate insulation layer 220, a gate electrode 225, a source electrode 243 and a drain electrode 245. The display structure may include a first electrode 260, a display layer 280 and a second electrode 290.

The substrate W may include a glass substrate, a transparent plastic substrate or a flexible plastic substrate.

A barrier layer 210 may be formed on an upper surface of the substrate W. Moistures penetrating through the substrate W may be blocked by the barrier layer 210, and impurity diffusion between the substrate W and structures thereon may also be blocked by the barrier layer 210. For example, the barrier layer 210 may include silicon oxide, silicon nitride, or silicon oxynitride. These materials may be used alone or in a combination to form the barrier layer 210. In an embodiment, the barrier layer 210 may have a multi-layered structure including a silicon oxide layer and a silicon nitride layer.

The active pattern 215 may include a silicon compound such as polysilicon. In some embodiments, the active pattern 215 may include an oxide semiconductor such as indium gallium zinc oxide (IGZO), zinc tin oxide (ZTO), or indium tin zinc oxide (ITZO). For example, the active pattern 215 including the silicon compound or the oxide semiconductor may be formed by a sputtering process, and then may be patterned by a photo-lithography process.

The gate insulation layer 220 may be formed on the barrier layer 210, and may cover the active pattern 215. The gate insulation layer 220 may include silicon oxide, silicon nitride and/or silicon oxynitride. The gate insulation layer 220 may have a multi-layered structure including a silicon oxide layer and a silicon nitride layer.

The gate electrode 225 may be formed on the gate insulation layer 220, and may be superimposed over the active pattern 215. For example, a first conductive layer may be formed on the gate insulation layer 220, and may be patterned by a photo-lithography process to form the gate electrode 225. The first conductive layer may be formed of a metal such as Al, Ag, W, Cu, Mo, Ti, Ta, Cr, etc., or a nitride thereof by a sputtering process or an ALD process. The first conductive layer may be formed as a multi-layered structure such as an Al/Mo structure or a Ti/Cu structure. In some embodiments, a scan line may be also formed from the first conductive layer. The gate electrode 225 may be diverged from the scan line.

In some embodiments, an ion-implantation process may be performed using the gate electrode 225 as an implantation mask such that a source region and a drain region may be formed at both ends of the active pattern 215. A portion of the active pattern 215 between the source and drain regions, which may overlap the gate electrode 225, may be defined as a channel region through which a charge may be moved or transferred.

An insulating interlayer 230 may be formed on the gate insulation layer 220, and may cover the gate electrode 225. The insulating interlayer 230 may include silicon oxide, silicon nitride and/or silicon oxynitride. The insulating interlayer 230 may have a multi-layered structure including a silicon oxide layer and a silicon nitride layer.

The source electrode 243 and the drain electrode 245 may extend through the insulating interlayer 230 and the gate insulation layer 220 to be in contact with the active pattern 215. The source electrode 243 and the drain electrode 245 may be in contact with the source region and the drain region, respectively, of the active pattern 215. For example, the insulating interlayer 230 and the gate insulation layer 220 may be partially etched to form contact holes through which the active pattern 215 may be exposed. A second conductive layer filling the contact holes may be formed on the insulating interlayer 230, and may be patterned by a photo-lithography process to form the source electrode 243 and the drain electrode 245. The second conductive layer may be formed from a material and a process substantially the same as or similar to those for the first conductive layer. In some embodiments, a data line may be also formed from the second conductive layer. In this case, the source electrode 243 may be diverged from the data line.

The TFT may be formed in each pixel of the display unit 200 by one or more of the processes as described above. In some embodiments, at least two TFTs and a capacitor may be formed in the each pixel.

A via insulation layer 250 may be formed on the insulating interlayer 230, and may cover the source and drain electrodes 243 and 245. The via insulation layer 250 may be formed using an organic material such as polyimide, an epoxy resin, an acrylate-based resin, and polyester by a spin coating process or a slit coating process. The via insulation layer 250 may also serve as a planarization layer of the display unit 200.

The display structure may be formed on the via insulation layer 250. The first electrode 260 may extend through the via insulation layer 250, and may be electrically connected to the drain electrode 245. For example, the via insulation layer 250 may be partially etched to form a via hole through which the drain electrode 245 may be exposed. A third conductive layer sufficiently filling the via hole may be formed on the via insulation layer 250, and may be patterned by a photo-lithography process to form the first electrode 260. The first electrode 260 may serve as an anode or a pixel electrode of the display unit 200, and may be formed per the each pixel of the display unit 200.

The third conductive layer may be formed from a material and a process substantially the same as or similar to those for the first conductive layer. In some embodiments, the third conductive layer may be formed of a transparent conductive layer such as indium tin oxide (ITO), indium zinc oxide (IZO), zinc oxide, indium oxide, etc.

A pixel defining layer (PDL) 270 may be formed on the via insulation layer 250 to cover a peripheral portion of the first electrode 260. For example, the PDL 270 may be formed using a photosensitive organic material by exposure and developing processes. Alternatively, the PDL 270 may be formed of a silicon-based inorganic material by a photo-lithography process. In example embodiments, an area of the first electrode 260 exposed by the PDL 270 may substantially correspond to an emitting region of the each pixel.

The display layer 280 may be formed on the first electrode 260 and the PDL 270. In example embodiments, the display layer 280 may include an organic light emitting material, and the display device may be provided as an OLED device. In this case, a hole transport layer (HTL) and an electron transport layer (ETL) may be further formed under the display layer 280 and on the display layer 280, respectively. The display layer 280 may be formed by individually printing the organic light emitting material at each pixel. The HTL and the ETL may be formed at the each pixel, or may be formed commonly at a plurality of the pixels.

In some embodiments, a liquid crystal material may be used for the display layer 280. In this case, the display device may be provided as an LCD device.

The second electrode 290 may be formed on the PDL 270 and the display layer 280. In some embodiments, the second electrode 290 may serve as a common electrode formed on the plurality of the pixels. The second electrode 290 may also serve as a cathode of the display unit 200. The second electrode 290 may be formed by a depositing a metal or a transparent conductive material as mentioned above through, for example, an open mask.

As described above, the display unit 200 may be formed on the substrate W, and the mirror substrate 100 may be formed on the substrate W using the sealing member 130 such that the mirror substrate 100 and the substrate W may face each other. In some embodiments, the mirror patterns 120 formed in the second region II may serve as an align-key for the mirror substrate 100.

A portion of the mirror substrate 100 between the neighboring mirror patterns 120 may substantially overlap the emitting region of the display unit 200. The first mirror layer 110 having a reflectivity less than that of the mirror patterns 120 may overlie the emitting region so that a display property may be realized over the emitting region. A non-emitting region of the display unit 200 may overlap a stacked structure including the first mirror layer 110 and the mirror patterns 120 of the mirror substrate 100. Therefore, a mirror property may be realized over the non-emitting region.

Figure 16:
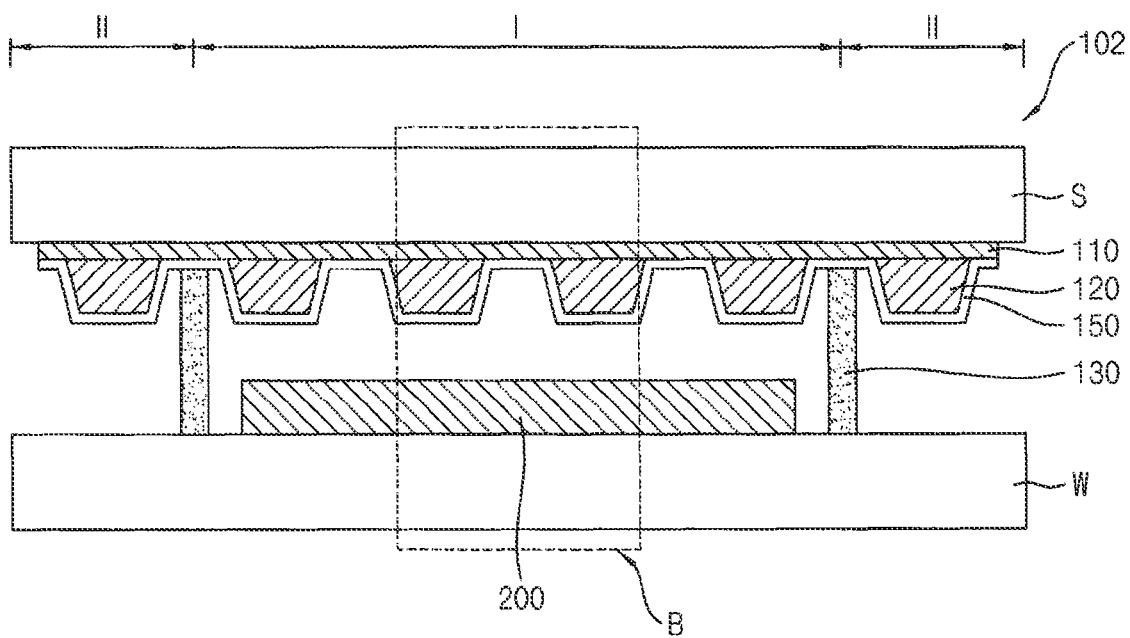
Figure 17:
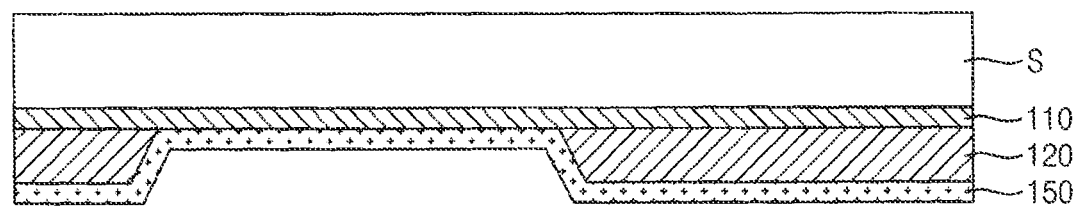
Figure 17:
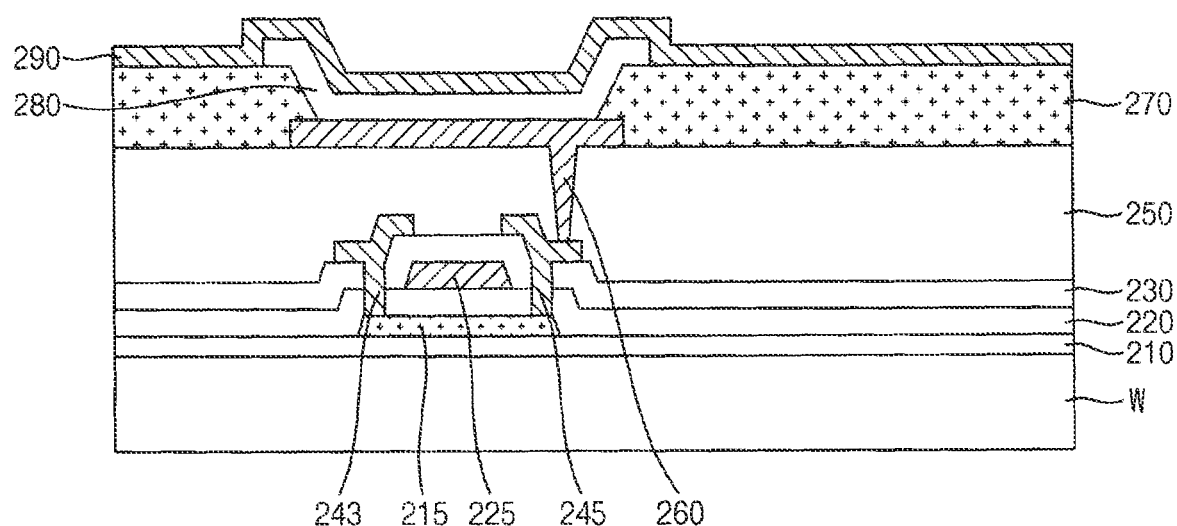

FIG. 16 is a schematic cross-sectional view illustrating a display device in accordance with some example embodiments. FIG. 17 is a partial enlarged view of a portion indicated as "B" in FIG. 16.

The display device illustrated in FIGS. 16 and 17 may have structures and/or constructions substantially the same as or similar to those of the display device illustrated in FIGS. 14 and 15 except for a second mirror layer. Thus, detailed descriptions on repeated elements and structures may be omitted herein.

Referring to FIGS. 16 and 17, the mirror substrate 102 illustrated with reference to FIG. 10 may be utilized as the mirror substrate. As described above, the mirror substrate 102 may include a first mirror layer 110, a plurality of mirror patterns 120 on an opposing surface of a transparent substrate S relative to the substrate W and a second mirror layer 150 covering the mirror patterns 120 and the first mirror layer 110. The first and second mirror layers 110 and 150 may be formed conformally throughout the first and second regions I and II of the transparent substrate S.

A sealing member 130 may be interposed between the transparent substrate S and the substrate W to encapsulate the display unit 200. In this case, the mirror substrate 102 may substantially serve as an encapsulation substrate. The sealing member 130 may be in contact with the second mirror layer 150 of the mirror substrate 102 between the first region I and the second region II to protect the display unit 200. The display unit 200 may overlap the first region I of the mirror substrate 102, and a peripheral circuit such as a driving circuit or a FPC connecting pad may be disposed on a portion of the substrate W overlapping the second region II. The display unit 200 may include a switching device on the substrate W, and a display structure electrically connected to the switching device.

As described above, the display unit 200 may be formed on the substrate W, and the mirror substrate 102 may be formed on the substrate W using the sealing member 130 such that the mirror substrate 102 and the substrate W may face each other. In some embodiments, the mirror patterns 120 formed in the second region II may serve as an align-key for the mirror substrate 102.

A portion of the mirror substrate 102 between the neighboring mirror patterns 120 may substantially overlap the emitting region of the display unit 200. The first and second mirror layers 110 and 150 having a reflectivity less than that of the mirror patterns 120 may overlie the emitting region so that a display property may be realized over the emitting region. A non-emitting region of the display unit 200 may overlap a stacked structure including the first and second mirror layers 110 and 150 and the mirror patterns 120 of the mirror substrate 102. Therefore, a mirror property may be realized over the non-emitting region.

The present disclosure is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure, for example, as defined in the claims. Therefore, it is to be understood that the foregoing is illustrative of various example embodiments and is not to be construed as being limited to the specific example embodiments disclosed, and that modifications to the disclosed example embodiments, as well as other example embodiments, are intended to be included within the scope of the present disclosure.

What is claimed is:

1. A display device comprising:
a display unit disposed on a substrate;
a mirror substrate facing the substrate with respect to the display unit, the mirror substrate including:
a first mirror layer extending continuously on a surface of a transparent substrate; and
a plurality of mirror patterns arranged on the first mirror layer; and
a sealing member encapsulating the display unit between the substrate and the mirror substrate, the sealing member being overlapped with the first mirror layer, wherein a reflectivity of the first mirror layer is less than a reflectivity of the mirror patterns.

2. The display device of claim 1, further comprising:
a second mirror layer extending continuously along the first mirror layer and the plurality of mirror patterns.

3. The display device of claim 2, wherein the second mirror layer is disposed on the first mirror layer.

4. The display device of claim 2, wherein the plurality of mirror patterns is disposed between the first mirror layer and the second mirror layer.

5. The display device of claim 2, wherein thicknesses of the first and second mirror layers are less than a thickness each of the plurality of mirror patterns.

6. The display device of claim 1, wherein a display unit includes an emitting region and a non-emitting region.

7. The display device of claim 6, wherein the first mirror layer is interposed between the transparent substrate and the mirror patterns in the non-emitting region.

8. A display device comprising:
a display unit disposed on a substrate;

a mirror substrate facing the substrate with respect to the display unit, the mirror substrate including:

a first mirror layer extending continuously on a surface of a transparent substrate; and a plurality of mirror patterns arranged on the first mirror layer; and a sealing member encapsulating the display unit between the substrate and the mirror substrate, the sealing member being overlapped with the first mirror layer, wherein the transparent substrate is divided into a first region and a second region by the sealing member, wherein a reflectivity of the first mirror layer is less than a reflectivity of the mirror patterns.

9. The display device of claim 8, wherein the display unit is overlapped with the first region.

10. The display device of claim 8, wherein the display unit includes an emitting region and a non-emitting region, and wherein the emitting region overlaps a portion of the first mirror layer between neighboring ones of the plurality of mirror patterns.

11. The display device of claim 10, wherein the non-emitting region overlaps a stacked structure including the first mirror layer and each of the plurality of mirror patterns.

12. The display device of claim 8, further comprising:

a second mirror layer extending continuously along the first mirror layer and the plurality of mirror patterns.

13. The display device of claim 12, wherein the second mirror layer is disposed on the first mirror layer.

14. The display device of claim 12, wherein the plurality of mirror patterns is disposed between the first mirror layer and the second mirror layer.

15. The display device of claim 12, wherein thicknesses of the first and second mirror layers are less than a thickness each of the plurality of mirror patterns.

16. The display device of claim 8, wherein a display unit includes an emitting region and a non-emitting region, and wherein the first mirror layer is interposed between the transparent substrate and the mirror patterns in the non-emitting region.

* * * * *